United States Patent
Yamazaki et al.

(10) Patent No.: US 8,378,473 B2
(45) Date of Patent: Feb. 19, 2013

(54) SEMICONDUCTOR DEVICE HAVING SEMICONDUCTOR CHIP WITHIN MULTILAYER SUBSTRATE

(75) Inventors: Shunpei Yamazaki, Setagaya (JP); Yasuyuki Arai, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/952,925

(22) Filed: Nov. 23, 2010

(65) Prior Publication Data
US 2011/0068438 A1    Mar. 24, 2011

Related U.S. Application Data

(63) Continuation of application No. 11/878,510, filed on Jul. 25, 2007, now Pat. No. 7,838,976.

(30) Foreign Application Priority Data

Jul. 28, 2006   (JP) .................................. 2006-206798

(51) Int. Cl.
| | |
|---|---|
| H01L 23/02 | (2006.01) |
| H01L 23/06 | (2006.01) |
| H01L 23/48 | (2006.01) |
| H01L 23/12 | (2006.01) |
| H01L 23/053 | (2006.01) |
| H01L 23/14 | (2006.01) |
| H01L 23/00 | (2006.01) |
| H01L 23/34 | (2006.01) |

(52) U.S. Cl. ........ 257/679; 257/684; 257/689; 257/698; 257/700; 257/701; 257/702; 257/703; 257/704; 257/728

(58) Field of Classification Search .................... 257/728
See application file for complete search history.

(56) References Cited

U.S. PATENT DOCUMENTS

| | | | |
|---|---|---|---|
| 4,701,427 A | * | 10/1987 | Boecker et al. ................ 501/92 |
| 4,788,102 A | | 11/1988 | Koning et al. |
| 5,219,377 A | | 6/1993 | Poradish |
| 5,598,032 A | | 1/1997 | Fidalgo |
| 5,796,165 A | | 8/1998 | Yoshikawa et al. |
| 5,800,763 A | | 9/1998 | Hoppe et al. |

(Continued)

FOREIGN PATENT DOCUMENTS

| | | |
|---|---|---|
| DE | 195 00 925 | 7/1996 |
| JP | 02-005448 | 1/1990 |

(Continued)

OTHER PUBLICATIONS

Search Report (Application No. 07014691.5) dated Apr. 14, 2008.

*Primary Examiner* — N Drew Richards
*Assistant Examiner* — Michael Jung
(74) *Attorney, Agent, or Firm* — Eric J. Robinson; Robinson Intellectual Property Law Office, P.C.

(57) ABSTRACT

In inlets used for ID tags and the like, a defective connection between an integrated circuit part and an antenna is suppressed by improvement of tolerance for a bending or a pressing pressure. The integrated circuit part includes a semiconductor chip and a multilayer substrate having a concave portion. The semiconductor chip is mounted on the bottom of the concave portion. The multilayer substrate includes a connection electrode at the top surface and a connection electrode connected to the semiconductor chip on the bottom of the concave portion. The connection electrode on the bottom of the concave portion is connected to the connection electrode at the top surface by a penetration electrode inside a multilayer substrate. By such a configuration, the semiconductor chip is connected to the antenna.

16 Claims, 9 Drawing Sheets

U.S. PATENT DOCUMENTS

| | | | |
|---|---|---|---|
| 5,912,200 A * | 6/1999 | Miyake et al. | 501/92 |
| 6,020,627 A | 2/2000 | Fries et al. | |
| 6,301,119 B1 | 10/2001 | Thevenot et al. | |
| 6,424,315 B1 | 7/2002 | Glenn et al. | |
| 6,478,228 B1 | 11/2002 | Ikefuji et al. | |
| 6,528,875 B1 * | 3/2003 | Glenn et al. | 257/704 |
| 6,570,469 B2 * | 5/2003 | Yamada et al. | 333/193 |
| 6,698,084 B2 | 3/2004 | Uchikoba | |
| 6,713,162 B2 | 3/2004 | Takaya et al. | |
| 6,809,413 B1 * | 10/2004 | Peterson et al. | 257/680 |
| 7,001,569 B2 * | 2/2006 | Saitoh et al. | 264/672 |
| 7,297,423 B2 | 11/2007 | Mizuno et al. | |
| RE40,137 E | 3/2008 | Tuttle et al. | |
| 7,432,784 B2 | 10/2008 | Togashi | |
| 7,440,256 B2 | 10/2008 | Hongo et al. | |
| 2003/0060172 A1 | 3/2003 | Kuriyama et al. | |
| 2004/0107555 A1 | 6/2004 | Hattori et al. | |
| 2005/0134463 A1 * | 6/2005 | Yamazaki | 340/572.8 |
| 2006/0017157 A1 * | 1/2006 | Yamamoto et al. | 257/728 |
| 2006/0049995 A1 * | 3/2006 | Imaoka et al. | 343/702 |
| 2006/0113511 A1 * | 6/2006 | Chen | 252/500 |
| 2007/0257797 A1 | 11/2007 | Rancien et al. | |
| 2008/0044660 A1 | 2/2008 | Takaya et al. | |

FOREIGN PATENT DOCUMENTS

| | | |
|---|---|---|
| JP | 08-321567 | 12/1996 |
| JP | 11-085938 A | 3/1999 |
| JP | 2002-049901 | 2/2002 |
| JP | 2004-102353 | 4/2004 |
| WO | WO 01/52184 | 7/2001 |

* cited by examiner

FIG. 8A
FIG. 8B
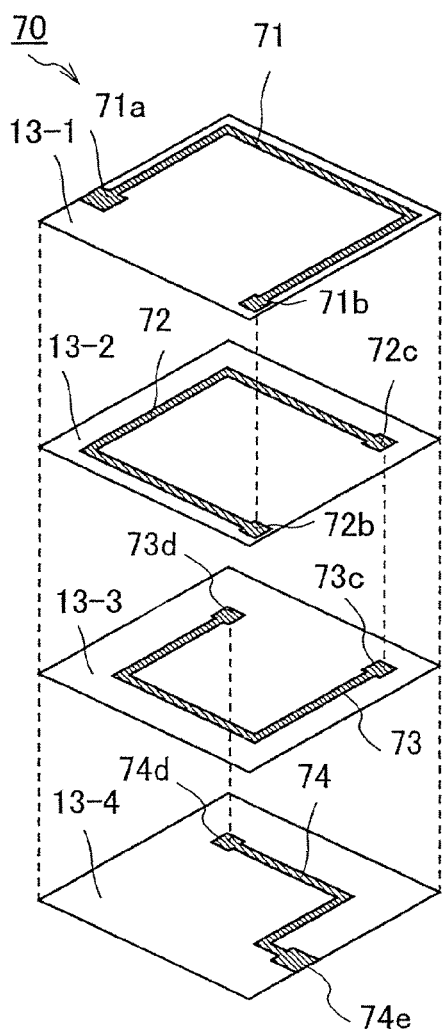
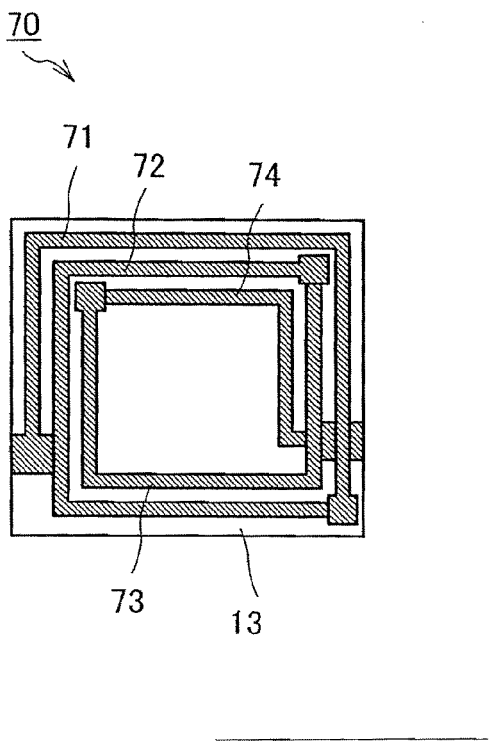

SEMICONDUCTOR DEVICE HAVING SEMICONDUCTOR CHIP WITHIN MULTILAYER SUBSTRATE

BACKGROUND OF THE INVENTION

1. Field of the Invention

The present invention relates to information recording carriers which are utilized in the information technology referred to as RFID (Radio Frequency Identification). Specifically, the present invention relates to semiconductor devices capable of inputting and outputting information by electromagnetic waves. Moreover, the present invention relates to semiconductor devices such as noncontact type IC tags or inlets (also referred to as inlays and inserts) incorporated in such noncontact type IC tags.

2. Description of the Related Art

Information technology which is referred to as RFID (Radio Frequency Identification) has been spreading. For example, an IC tag is known, which is a tag having an outside dimension of several centimeters, storing data and communicating with a reader wirelessly. An IC tag includes an antenna and an IC chip having a communication circuit and a memory.

One mode of an IC tag is known, in which an IC tag is embedded in paper (for example, Reference 1: Japanese Published Patent Application No. 2002-049901, and Reference 2: Japanese Published Patent Application No. 2004-102353). According to Reference 1, in order to embed an IC tag having a thickness of less than or equal to 200 μm in an object such as paper, a metal layer for forming an antenna is formed to be thinner in a region in which an IC chip is mounted than the other regions. According to Reference 2, a semiconductor chip formed by sectioning a semiconductor wafer is connected to an antenna and is sealed by resin, thereby thinning an IC tag.

SUMMARY OF THE INVENTION

There are various kinds of paper which are commercially available. For example, A4-sized copy paper has a thickness of about 90 μm. In order to embed an IC tag in such ordinary paper without giving users a sense of uncomfortableness during use, it is necessary to make the thickness of the IC tag much thinner. However, there arises a problem in that an IC tag is easily broken by pressure applied by a pointed object or bending stress, as the IC tag becomes thinner. In such a case, for example, in Reference 2, a semiconductor chip is only sealed by resin.

In a case in which an IC tag is mounted on a surface of or in a paper base material, it is necessary to try not to break the IC tag in a manufacturing process. Further, the paper base material needs to have a surface on which characters and the like can be printed or written with a writing instrument. For example, when letters are written with a ballpoint pen, pen pressure is greater than or equal to 10 MPa. The IC tag mounted on the paper base material should withstand the pen pressure.

The present invention has an object to prevent breakage of IC tags and electronic devices having similar functions to the IC tags caused by pressing force (pressure) or bending stress, without thickening the IC tags and the electronic devices.

The present invention relates to information recording carriers which are utilized for RFIDs. For example, the present invention relates to semiconductor devices such as noncontact type IC cards, contact type IC tags, or inlets incorporated in IC cards or IC tags. In this specification, the term "inlet" means a semiconductor device including at least an integrated circuit and an antenna.

A semiconductor device of the present invention includes an integrated circuit part and an antenna electrically connected to the integrated circuit part. The integrated circuit part includes various functional circuits such as a communication circuit and/or a memory circuit (memory) storing data in order to input and output data (also referred to as information) by an electromagnetic wave.

An integrated circuit part of the present invention includes a semiconductor chip and a body structure having a concave portion. The semiconductor chip is fixed on the bottom of the concave portion. Further, the body structure includes a connection electrode connected to the antenna and a conductor formed inside the body structure. The semiconductor chip is connected to the connection electrode via the conductor. One feature of the present invention is that in the integrated circuit part, the connection portion with the antenna is provided in the body structure, not in the semiconductor chip.

The body structure is formed of a material having stronger rigidity than a base material of the antenna. Typically, ceramic is used. The body structure is a multilayer substrate formed of ceramic. The multilayer substrate is a stacked body in which at least two dielectric layers are stacked and a conductor or a resistor is formed in a given layer.

When an integrated circuit part is formed using a multilayer substrate in which two or more substrates are stacked in a body structure, a semiconductor device of the present invention includes a multilayer substrate, a semiconductor chip fixed on the bottom of a concave portion of the multilayer substrate, a connection electrode connected to the antenna in the top face, and a penetration electrode which penetrates at least one substrate of the multilayer substrate, and the semiconductor chip is connected to the connection electrode via the penetration electrode. One feature of the present invention is that in the integrated circuit part, the connection portion with the antenna is provided in the multilayer substrate, not in a semiconductor chip.

The multilayer substrate can also be provided with a conductor (a side electrode) formed on a surface of a dielectric layer, in addition to a conductor penetrating the dielectric layer (a penetration electrode).

In the multilayer substrate, a passive element such as a resistor, a capacitor, a coil, or an antenna is formed from such a conductor or a resistor. In addition, in the multilayer substrate, a circuit in which such passive elements are combined is formed. The passive element is connected to a semiconductor chip via at least a conductive layer formed on the bottom of a concave portion. Such a conductor and a resistor formed in the multilayer substrate are formed by baking a paste for a thick material.

In accordance with the present invention, rigidity of a semiconductor device can be enhanced by forming a body structure with ceramic or the like for protecting a semiconductor chip, so that durability and desired function of the semiconductor device can be maintained. For example, even when pressure is applied by a pointed object such as a pen tip, defective operation of a semiconductor chip due to stress to the semiconductor chip can be prevented. Further, the semiconductor chip can tolerate a bending stress.

In the body structure formed of ceramic or the like, a connection portion between an antenna and an integrated circuit is formed, and thus the integrated circuit part can be connected to the antenna without thickening the semiconductor device. Since the body structure is formed of an elastic material such as ceramic, defective connection with the antenna caused by bending stress can be prevented.

A portion of passive parts constituting a functional circuit is formed in the body structure, thereby miniaturizing the semiconductor chip. Further, a memory can be expanded in a spare region. Additionally, other functional circuits can be provided in such a spare region as well. Thus, the semiconductor device can be multifunctional and highly-functional.

BRIEF DESCRIPTION OF DRAWINGS

In the accompanying drawings:

FIG. 1A is a plan view, FIG. 1B is a cross-sectional view taken along the line b-b, FIG. 1C is a plan view of a semiconductor chip, and FIG. 1D is a perspective view of the body structure (Embodiment Mode 1);

FIGS. 8A and 8B are an exploded perspective view and a plan view of an power-feeding antenna, respectively (Embodiment Mode 3)

DETAILED DESCRIPTION OF THE INVENTION

Embodiment Mode

Figure 1A:
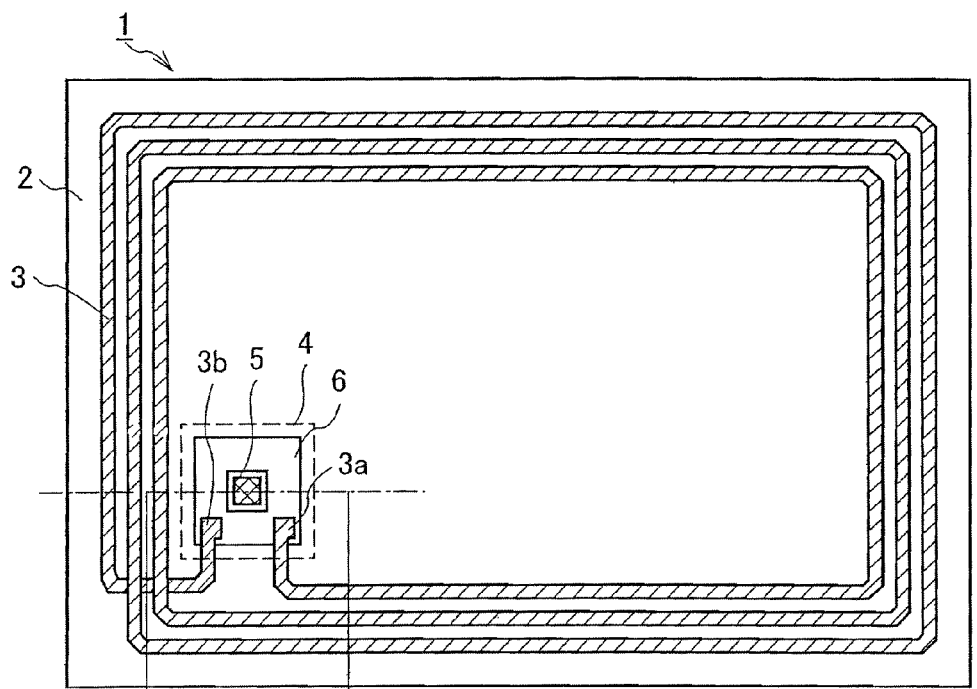
FIGS. 1A to 1D show one mode of a semiconductor device in accordance with the present invention.

Embodiment Modes of the present invention will now be described with reference to the drawings. Note that it is easily understood by those skilled in the art that the present invention is not limited to the following description and various changes may be made in modes and details without departing from the spirit and the scope of the present invention. Hereinafter, Embodiment Modes 1 to 4 of the present invention will now be described. The invention described in Embodiment Modes 1 to 4 can be conducted by combining configurations described in different embodiment modes and different drawings. Therefore, the present invention should not be limited to the following descriptions of the embodiment modes of this specification. In addition, where the same components are depicted or components having the same function are described herein as various configurations of the present invention, the same reference numerals are commonly given and the descriptions therefore are not repeated.

Embodiment Mode 1

Embodiment Mode 1 will describe a semiconductor device of the present invention with reference to FIGS. 1A to 1D.

Figure 1B:
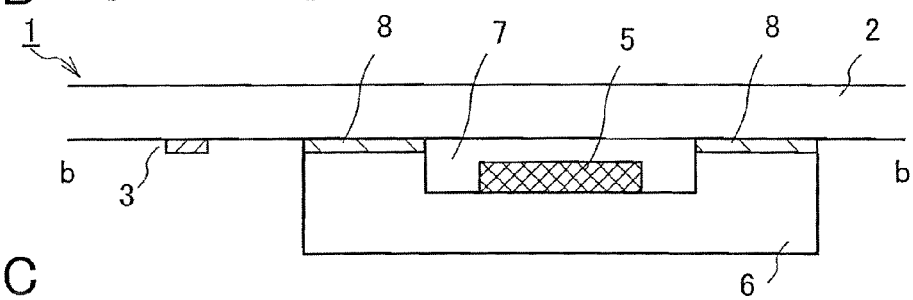

FIGS. 1A to 1D illustrate a mode in which a semiconductor device of the present invention is used as an inlet incorporated in a plastic card or an inlet embedded in paper. FIG. 1A is a plan view of an inlet 1, and FIG. 1B is a cross-sectional view taken along the dotted line b-b of FIG. 1A.

The inlet 1 includes an antenna 3 formed on a base material 2 and an integrated circuit part 4 connected to the antenna 3. The integrated circuit part 4 includes a semiconductor chip 5 and a body structure 6, and the semiconductor chip 5 is fixed on the bottom of a concave portion 7 formed in the body structure 6. The body structure 6 is fixed on the base material by a fixing agent 8 such as a resin. By this configuration, the integrated circuit part 4 is fixed on the base material 2. As for the antenna 3, an insulating layer is formed in an overlapping portion of wirings in order to prevent short-circuiting.

The base material 2 may be any material such as a plastic sheet, a plastic film, a glass epoxy resin, a glass plate, a piece of paper, a nonwoven fabric or the like. The antenna 3 includes antenna terminals 3a, 3b for connection with the integrated circuit part 4. The configuration and shape of the antenna 3 can be changed depending on a communication frequency band. When the communication frequency band is a high frequency band, a loop antenna, a spiral antenna or the like can be used as shown in FIG. 1A. On the contrary, when the communication frequency band is a frequency in a UHF band or a microwave band, a dipole antenna may be used, and further, a monopole antenna, a patch antenna, or the like may be used.

Figure 1C:
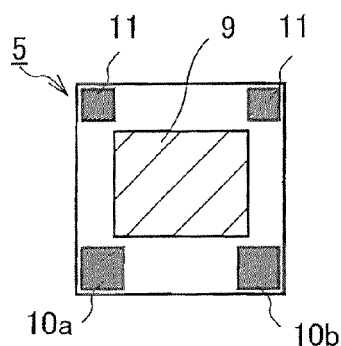

The integrated circuit part 4 is a component including a circuit which is needed for wireless communication. The circuit is used for wireless communication in addition to an antenna. FIG. 1C is a plan view of the semiconductor chip 5. The semiconductor chip 5 is a bare chip formed by dividing a semiconductor wafer into individual chips. In the semiconductor chip 5, an integrated circuit 9 including various functional circuits such as a communication circuit and a memory circuit storing data, connection electrodes 10a, 10b and connection electrodes 11 are formed. The connection electrodes 10a, 10b are electrodes for connection with the antenna 3. Specifically, the connection electrodes 10a, 10b are connected to the antenna terminals 3a, 3b, respectively. The connection electrodes 11 are electrodes for connection with a passive element formed in the body structure 6. Each connection electrode 10a, 10b, 11 is connected to the integrated circuit 9.

The semiconductor chip 5 is put in a space of the concave portion 7. The concave portion 7 is formed such that a top face of the semiconductor chip 5 is lower than a top face of the body structure 6. The semiconductor chip 5 is fixed on the bottom of the concave portion 7 by solder, a wax material, a resin layer or the like. The connection electrodes 10a, 10b, 11 of the semiconductor chip 5 are connected to a conductor formed inside the body structure 6.

The body structure 6 has toughness, and preferably has elasticity to a certain level of bending stress. When the base material 2 is formed of a flexible material such as a plastic film or a nonwoven fabric, the body structure 6 has a certain level of elasticity, so that the bending stress can be dispersed. For example, the body structure 6 is formed of a dielectric material such as rigid plastic or glass. In particular, a ceramic material is preferably used, because the ceramic material realizes the foregoing characteristics. Ceramic materials are a variety of materials and thus a plurality of ceramics can be combined in a composition.

Typical examples of ceramic materials are given. Alumina ($Al_2O_3$) is preferably used as a highly insulating material. In addition, barium titanate ($BaTiO_3$) is preferably used as a high capacity material. When mechanical strength has a higher priority, alumina ($Al_2O_3$), titanium oxide ($TiO_x$), silicon carbide (SiC), tempered glass, or crystallized glass is preferably used. In addition, when composite ceramics in which nanoparticles of SiC are added to $Si_3N_4$, or a composite ceramic containing hexagonal system boron nitride (BN) is used, high strength, oxidation resistance, and high toughness can be obtained, which is preferable.

These ceramic materials may be used to form a multilayer configuration in which a plurality of dielectric layers, each having a thickness of 0.1 μm to 2 μm, are stacked. In other words, the body structure 6 can be formed with the multilayer substrate in which a plurality of dielectric layers formed of the above ceramic materials are stacked.

Figure 1D:
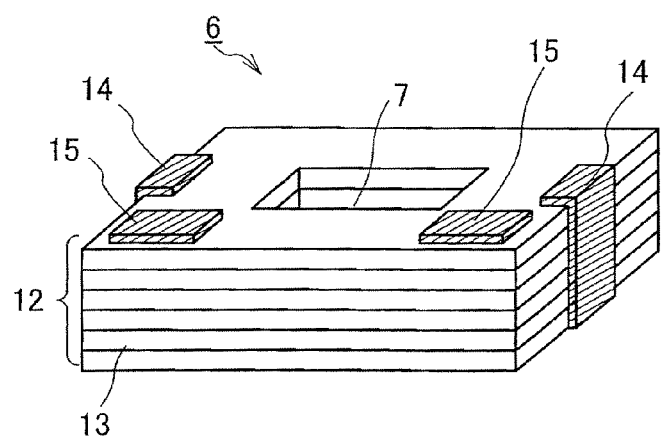

FIG. 1D is a perspective view of the body structure 6, and illustrates a mode in which a ceramic multilayer substrate 12 is applied to the body structure 6. In the multilayer substrate 12, a plurality of dielectric layers 13 formed of ceramic are stacked. In the multilayer substrate 12, a conductor or a resistor having a desired pattern is formed on any dielectric layer 13. Hereinafter, the conductor formed on the dielectric layer 13 is referred to as "internal conductive layer". Further, a conductor which penetrates the dielectric layer 13 (hereinafter, also referred to as a penetration electrode) is formed to connect the internal conductive layers and/or the resistors which are formed in different layers. Further, a conductor 14 (hereinafter, also referred to as a side electrode 14) is formed at the side of the multilayer substrate 12 to connect the internal conductive layer at the side of the multilayer substrate 12. The penetration electrode or the side electrode 14 is formed as needed. The internal conductive layer and the side electrode 14 are formed by printing a conductive paste and baking it. In addition, a conductive paste is used to fill a via hole formed in the dielectric layer 13 and the conductive paste is used as the penetration electrode. Alternatively, the inside is plated with metal to form the penetration electrode.

On the surface of the multilayer substrate 12 at the side where the concave portion 7 is provided (this surface is referred to as "top face" of the multilayer substrate, for the sake of convenience), antenna connection electrodes 15a, 15b directly connected to the antenna terminals 3a, 3b are formed. In addition, on the bottom of the concave portion 7, connection electrodes which are directly connected to the connection electrodes 10a, 10b, 11 of the semiconductor chip 5 are formed from the internal conductive layer.

Figure 2:
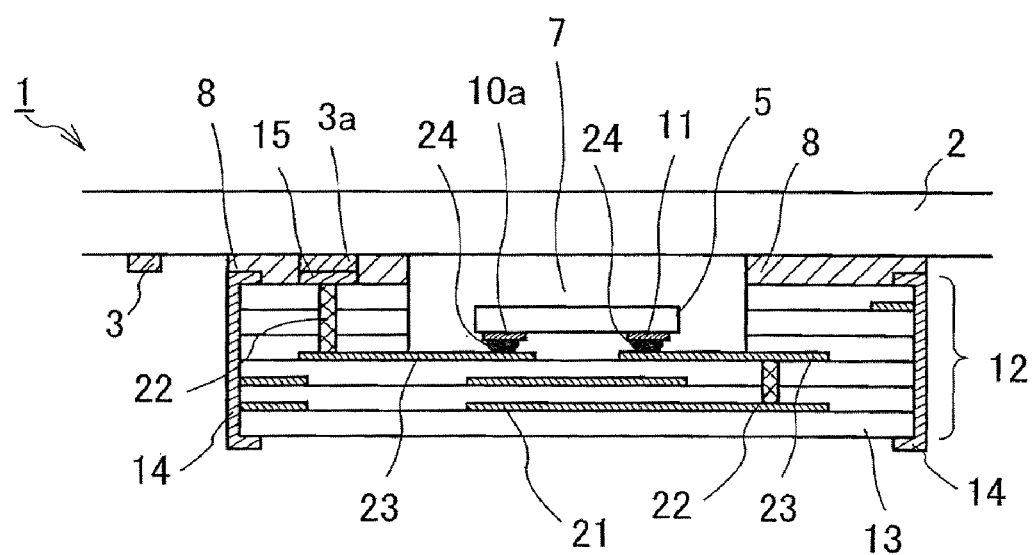
FIG. 2 is a cross-sectional view of a semiconductor device and illustrates a mode in which a semiconductor chip is mounted on a body structure by a flip chip method (Embodiment Mode 1)
Figure 3:
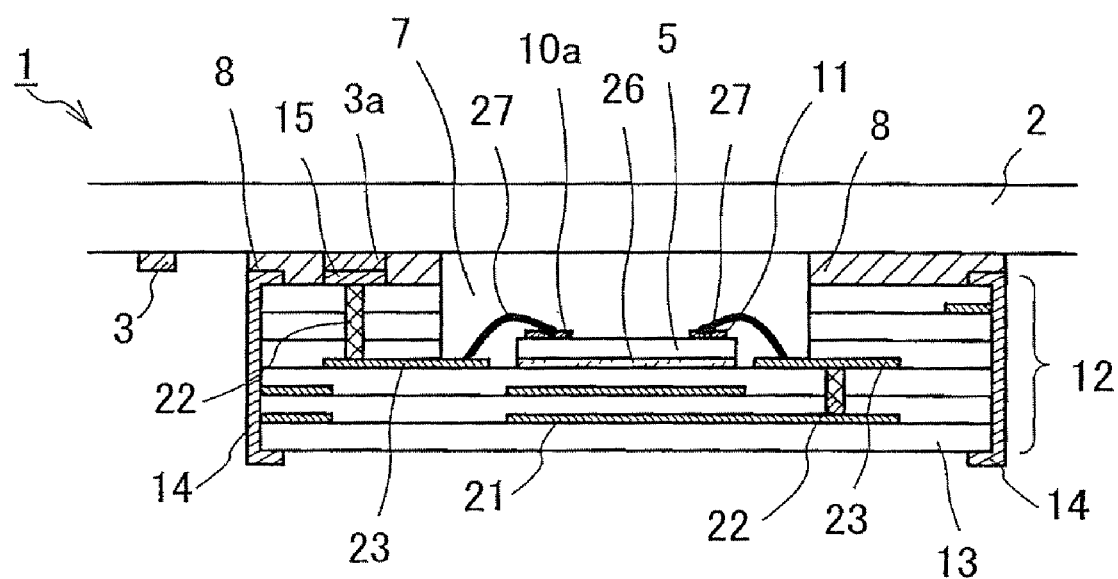
FIG. 3 is a cross-sectional view of a semiconductor device and illustrates a mode in which a semiconductor chip is mounted on a body structure by a wire-bonding method (Embodiment Mode 1)

Hereinafter, connections of the antenna terminals 3a, 3b, the semiconductor chip 5 and the multilayer substrate 12 (body structure 6) are described with reference to FIG. 2 and FIG. 3. FIG. 2 and FIG. 3 are partial cross-sectional views of the inlet 1 and schematic cross-sectional views for describing the connections.

The semiconductor chip 5 is connected to a connection electrode formed on the bottom of the concave portion 7 in the multilayer substrate 12. Examples are shown in which the semiconductor chip 5 is mounted by a flip chip method and a wire bonding method.

FIG. 2 illustrates a mode in which the semiconductor chip 5 is mounted on the body structure 6 by a flip chip method. As described above, in the multilayer substrate 12, an internal wiring layer 21 on the dielectric layer 13, and a penetration electrode 22 which penetrates the dielectric layer 13 are formed. On the bottom of the concave portion 7 in the multilayer substrate 12, connection electrode layers 23 connected to the connection electrodes 10a, 10b, 11 of the semiconductor chip 5 are formed with the internal wiring layer 21. The side electrodes 14 are connected to the internal wiring layers 21 at the side of the multilayer substrate 12.

The semiconductor chip 5 is disposed such that the connection electrodes 10a, 10b, 11 face the bottom of the concave portion 7 (the connection electrodes face down). The connection electrodes 10a, 10b, 11 are connected to the connection electrode layers 23 by solder or a bump 24 formed of Au (gold) or the like. As a result, the connection electrodes 10a, 10b for the antennas are connected to the connection electrode 15 formed in the multilayer substrate 12 via the connection electrode layer 23 (internal wiring layer 21), and the penetration electrode 22 (the conductor penetrating the dielectric layer 13 formed in the side portion of the concave portion 7). The connection electrode 15 is connected to the antenna terminals 3a, 3b. Although FIG. 2 illustrates only the antenna terminal 3a, the connection of the antenna terminal 3b is similar to that of the antenna terminal 3a.

Meanwhile, the connection electrodes 11 for connection with the passive element formed in the multilayer substrate 12 are also connected to the internal wiring layer 21 constituting the passive element via the connection electrode layer 23 (internal wiring layer 21), and the penetration electrode 22, similar to the connection electrodes 10a, 10b. Although described later, the penetration electrode is not needed for the connection between the electrodes 11 and the passive element in some cases, depending on the configuration of the passive element.

FIG. 3 illustrates a mode in which the semiconductor chip 5 is mounted on the body structure 6 by a wire bonding method. Different from FIG. 2, the semiconductor chip 5 is disposed such that the bottom of the semiconductor chip faces the bottom of the concave portion 7, and is fixed on the multilayer substrate 12 by a die bonding material 26 such as solder, a wax material, or a resin adhesive. The connection electrodes 10a, 10b, 11 are connected to the connection electrode layer 23 by a metal thin wiring 27 of Al, Au or the like. The other parts are similar to those in FIG. 2. The connection electrodes 10a, 10b for the antenna are connected to the connection electrode 15 formed in the multilayer substrate 12 via the connection electrode layer 23 (internal wiring layer 21), and the penetration electrode 22 (the conductor penetrating the dielectric layer 13 formed adjacent to the concave portion 7), while the connection electrode 11 is connected to the passive element formed in the multilayer substrate 12 via the penetration electrode 22.

As shown in FIG. 3, the semiconductor chip 5 is mounted on the multilayer substrate 12 (body structure 6), so that the semiconductor chip 5 can be connected to the antenna 3 and the passive element formed in the multilayer substrate 12.

As shown in FIG. 1A to FIG. 3, the semiconductor device of the present invention has a configuration in which a bare chip is stored in the body structure formed of ceramic or the like, and a conductor for connection is formed in the body structure to connect the antenna and the bare chip. By this configuration, defective connection between the antenna and the connection part can be prevented, even when bending stress is applied to the semiconductor device.

Figure 4:
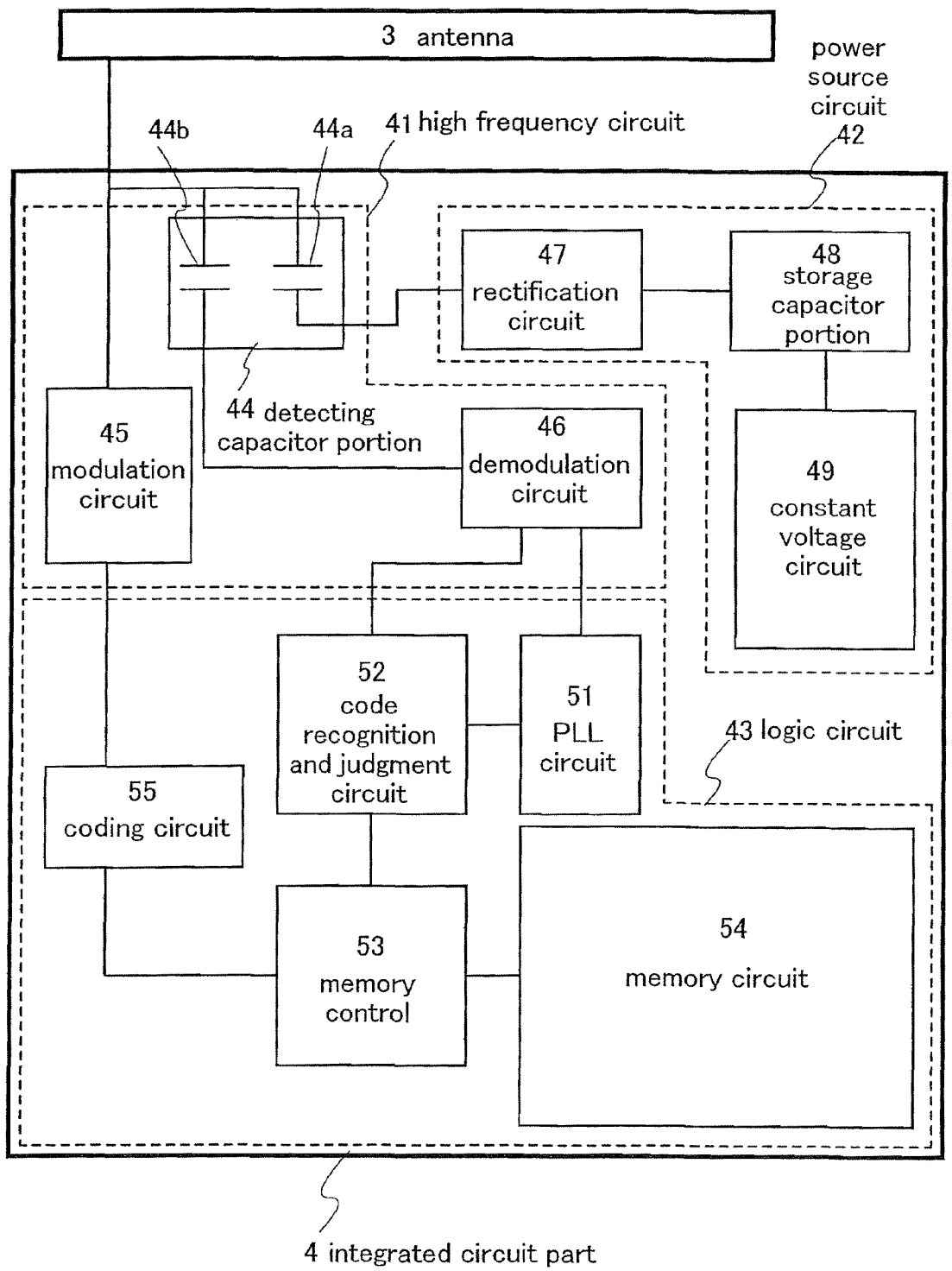
FIG. 4 is a block circuit diagram showing a circuitry example of a semiconductor device which inputs and outputs data wirelessly (Embodiment Mode 1)

The semiconductor device of the present invention inputs and outputs information (or data) by transmitting and receiving an electromagnetic wave (carrier wave) using the antenna 3. In addition, the semiconductor device of the present invention produces a DC voltage from the carrier wave received by the antenna 3 and supplies the voltage to each circuit as a power source. Hereinafter, the circuit configuration of the inlet 1 is exemplified. FIG. 4 is a block circuit diagram of the inlet 1.

The integrated circuit part 4 includes a high frequency circuit 41, a power source circuit 42, and a logic circuit 43 as components. The high frequency circuit 41 includes a detecting capacitor portion 44, a modulation circuit 45 and a demodulation circuit 46. The detecting capacitor portion 44 includes a detecting capacitor 44a for the power source circuit and a detecting capacitor 44b for the logic circuit. The power source circuit 42 includes a rectification circuit 47, a storage capacitor portion 48 including plural capacitors, and a constant voltage circuit 49. The logic circuit 43 includes a phase locked loop (PLL) circuit 51, a code recognition and judgment circuit 52, a memory controller 53, a memory circuit 54 storing information of individual identification, and a coding circuit 55.

The carrier wave received by the antenna 3 is divided into two via the detecting capacitor portion 44, i.e., one for the power source circuit 42 and the other for the logic circuit 43. In the power source circuit 42, the input carrier wave is subjected to half-wave rectification by the rectification circuit 47 to generate a DC voltage. The DC voltage is charged in the storage capacitor portion 48 as a power source. The constant voltage circuit 49 supplies power necessary for a circuit to the circuit at a constant voltage, in order to prevent breakage of circuits in the integrated circuit part 4 due to an intense electric field caused by the received carrier wave.

In the high frequency circuit 41, the demodulation circuit 46 demodulates the carrier wave to generate a clock signal necessary for operation of the logic circuit 43. The clock signal is input into the PLL circuit 51 and the code recognition and judgment circuit 52. When the received signal is an amplitude modulation (ASK) type signal, the demodulation circuit 46 detects data "0" or "1" from the variation of the amplitude. The modulation circuit 45 transmits transmission data as an amplitude modulation (ASK) type transmission signal.

The PLL circuit 51 corrects the clock signal. The code recognition and judgment circuit 52 identifies and judges an instruction code. Each instruction code recognized and judged by the code recognition and judgment circuit 52 is a signal of End of Frame (EOF), a signal of Start of Frame (SOF), a flag, a command code, a mask length, a mask value, or the like. The code recognition and judgment circuit 52 also has a cyclic redundancy check (CRC) function for detecting transmission errors. The judgment result by the code recognition and judgment circuit 52 is output to the memory controller 53. The memory controller 53 controls reading from the memory circuit 54 based on the judgment result.

The memory circuit 54 may be a mask ROM (Read Only Memory) which stores only fixed data, a memory which can be read and written at random such as an SRAM (Static Random Access Memory), a nonvolatile memory which has a floating electrode for accumulating electric charges, or the like.

Data read out from the memory circuit 54 is encoded with the coding circuit 55, and modulated by the modulation circuit 45 to generate a response signal. The response signal is transmitted as a carrier wave from the antenna 3.

As shown in FIG. 4, the semiconductor device of the present invention receives an instruction from a communication device such as a reader/writer, and has functions of writing data in the memory circuit 54 and reading out data from the memory circuit 54.

Embodiment Mode 2

A part of a passive element constituting an integrated circuit part 4 can be formed in a body structure 6. For reducing the power consumption, the passive element formed in the body structure 6 is preferably an element which does not need power generated by a power source circuit 42. For example, a part of or the whole capacitor constituting a detecting capacitor portion 44 can be provided in the body structure 6. In addition, a part of or the whole capacitor constituting a storage capacitor portion 48 which serves as a power source supplier can be provided in the body structure 6.

Figure 5A:
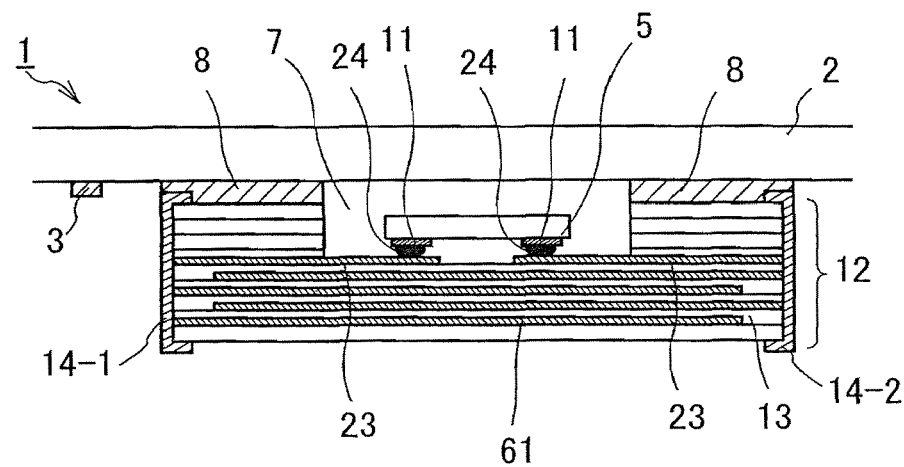
FIGS. 5A and 5B are cross-sectional views of semiconductor devices having a body structure in which a capacitor is formed, (Embodiment Mode 2)
Figure 5B:
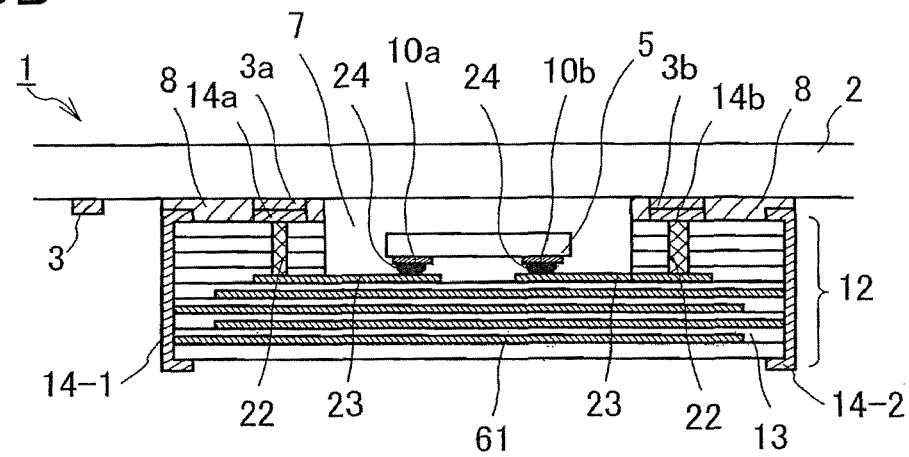

In this embodiment mode, a mode in which a capacitor is formed in the body structure 6 will be described with reference to FIGS. 5A and 5B. FIGS. 5A and 5B are cross-sectional views of an inlet 1. FIG. 5A is a cross-sectional view illustrating connection between the semiconductor chip 5 and the passive element, and FIG. 5B is a cross-sectional view illustrating connection between the semiconductor chip 5 and the antenna 3. In FIGS. 5A and 5B, a flip chip method is adopted for mounting the semiconductor chip 5 on the body structure 6; however, another method such as a wire bonding method as shown in FIG. 3 may be employed.

Capacitor electrode layers 61 formed of internal wiring layers are formed on a plurality of dielectric layers 13 to form a capacitor in a multilayer substrate 12. In the multilayer substrate 12, the dielectric layers 13 and the capacitor electrode layers 61 are overlapped alternately to be engaged. In addition, side electrodes 14-1, 14-2 opposite to each other are formed at sides of the multilayer substrate 12, and every other layer of the capacitor electrode layers 61 are connected to the side electrodes 14-1, 14-2, respectively. The dielectric layers 13 and the capacitor electrode layers 61 are stacked in this manner and the capacitor electrode layers 61 are connected by the electrodes 14-1, 14-2 to form the capacitor.

In the configuration example shown in FIG. 5A, the connection between the connection electrode 11 of the semiconductor chip 5 for a passive element and the capacitor is done by a connection electrode layer 23 (internal wiring layer 21) without using a penetration electrode 22, and the connection electrodes 23 are connected to the side electrodes 14-1, 14-2 constituting the capacitor. In this manner, the connection between the connection electrode 11 and the connection electrode layer 23 can be appropriately selected depending on the configuration of the passive element formed in the body structure 6.

As shown in FIG. 5B, the connection electrodes 10a, 10b of the semiconductor chip 5 are connected to the connection electrodes 14a, 14b formed on the surface of the multilayer substrate 12 via the bump 24, the connection electrode layer 23 and the penetration electrode 22. The connection electrodes 14a, 14b are connected to the antenna terminals 3a, 3b, respectively. By this connection, the semiconductor chip 5 is connected to the antenna terminals 3a, 3b.

The dielectric layers 13 constituting a part of the capacitor are formed by applying a ceramic paste on the substrate. The ceramic paste is a paste in which a ceramic material such as barium titanate ($BaTiO_3$), strontium titanate ($SrTiO_3$), or a lead-based complex perovskite compound material contains a binder compound, a plasticizer, and an organic solvent. Then, an electrode paste selected from copper or a copper alloy, nickel or a nickel alloy, silver or a silver alloy, and tin or a tin alloy, is printed thereon to form the capacitor electrode layers 61 (internal wiring layers 21). Note that if a penetration electrode is formed, an opening is formed to form the penetration electrode. The dielectric layers 13 and the capacitor electrode layers 61 are dried, and then, cut to have a predetermined size, and a plurality of the capacitor electrodes are stacked to be engaged with one another. The stacked capacitor electrodes are interposed between layers formed of a ceramic material. The binder is removed, and the layers are baked and heated.

In FIGS. 5A and 5B, the dielectric layer 13 and the capacitor electrode 61 constituting the capacitor can be formed to have a thickness of 0.1 µm to 1 µm by using nanoparticles. Accordingly, when five dielectric layers 13 each having a thickness of 2 µm are stacked, the thickness thereof is 10 µm. Further, even when ten dielectric layers 13 each having a thickness of 1 µm are stacked, the thickness thereof is not greater than 10 µm.

Embodiment Mode 3

In a body structure 6 (multilayer substrate 12), internal wiring layers 21 are formed into predetermined patterns, and stacked. The internal wiring layers 21 are connected to each other by a penetration electrode to form a loop antenna, or a coil antenna. Embodiment Mode 3 will describe a mode in which a second antenna is formed in the body structure 6.

Figure 6:
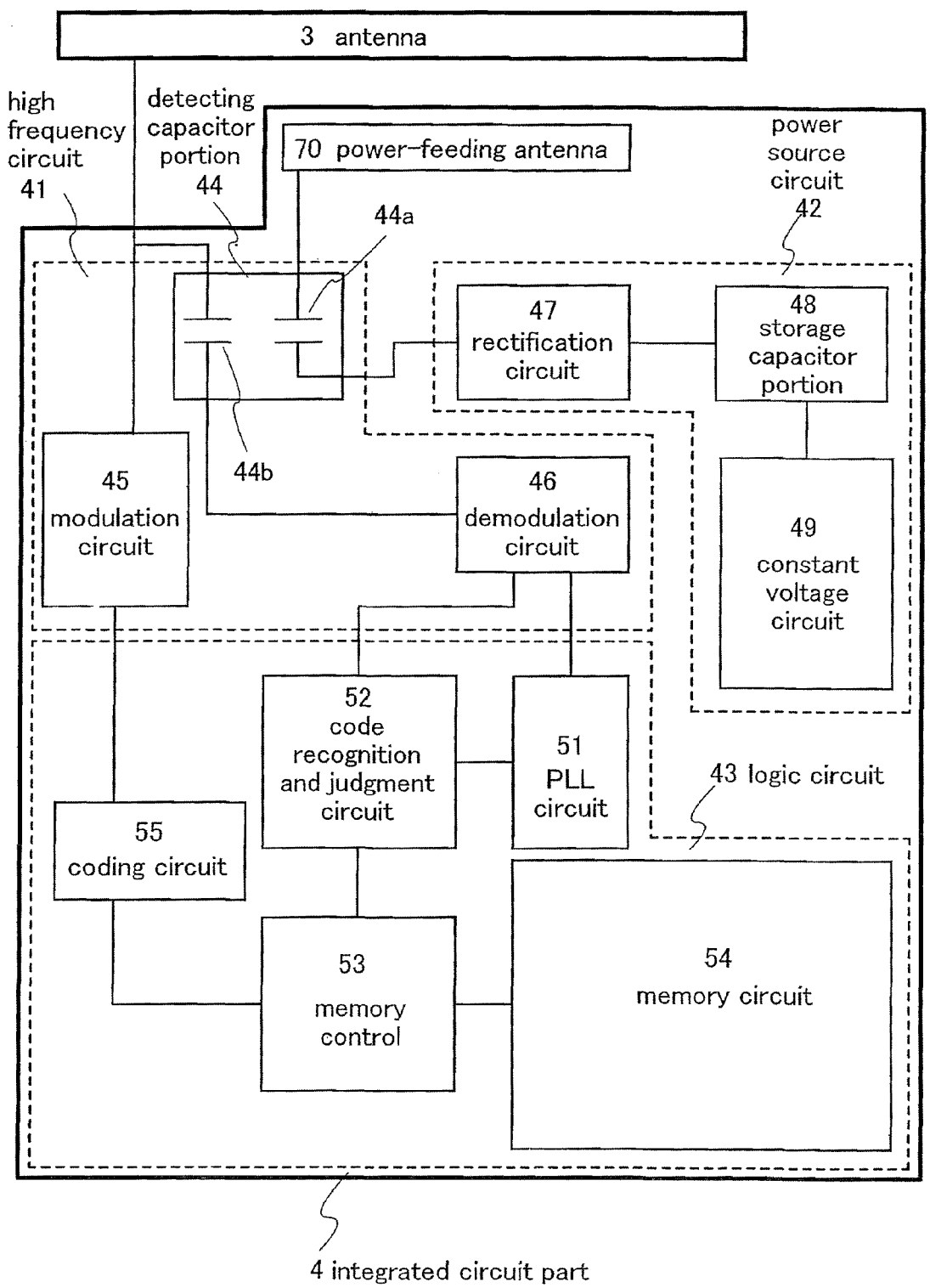
FIG. 6 is a block circuit diagram showing a circuitry example of a semiconductor device having a power-feeding antenna (Embodiment Mode 3)

First, a circuit configuration of an inlet 1 in Embodiment Mode 3 will now be described as an example. FIG. 6 is a block circuit diagram of the inlet 1. A power-feeding antenna 70 (a second antenna) is provided in an integrated circuit part 4. A detecting capacitor 44a for a power source circuit of a detecting capacitor portion 44 is connected to the power-feeding antenna 70, not to the antenna 3 (a first antenna). The other configurations are similar to those of the block circuit diagram shown in FIG. 4.

In this embodiment mode, the power-feeding antenna 70 provided in the integrated circuit part 4 is formed in the multilayer substrate 12 of the body structure 6. A configuration of a semiconductor device in this embodiment mode is described with reference to FIG. 7, FIGS. 8A and 8B.

Figure 7:
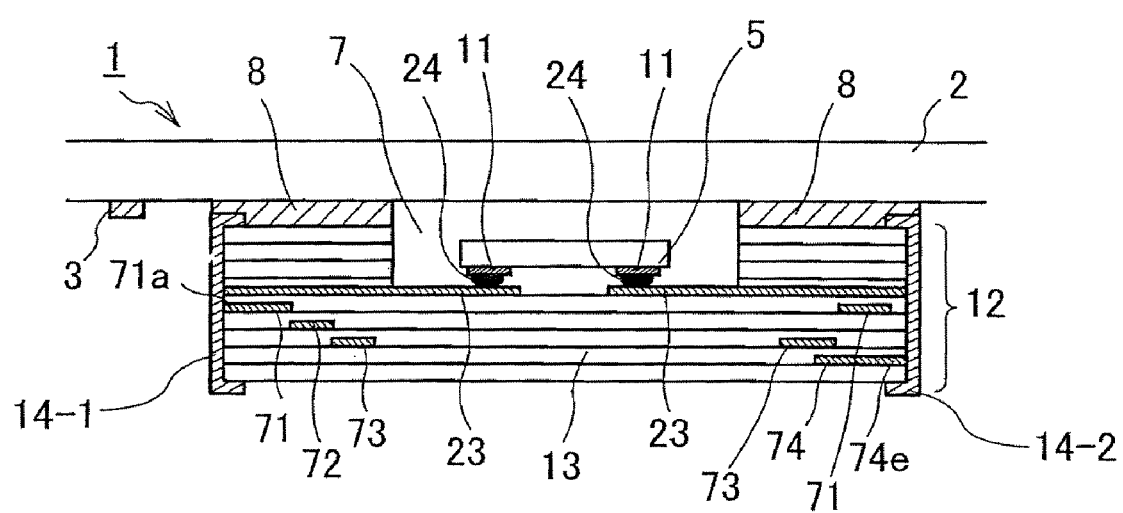
FIG. 7 is a cross-sectional view illustrating a semiconductor device having a body structure in which a power-feeding antenna is formed (Embodiment Mode 3)

FIG. 7 is a cross-sectional view of an inlet 1, and illustrates connection between a connection electrode 11 of a semiconductor chip 5 and a power-feeding antenna 70. Note that the connection between the semiconductor chip 5 and the antenna 3 is similar to that of FIG. 5B. FIG. 7 illustrates a mode in which a semiconductor chip 5 is mounted on a multilayer substrate 12 by a flip chip method as shown in FIG. 2. Alternatively, another mounting method, e.g., the wire bonding method as shown in FIG. 3 may be adopted.

As shown in FIG. 7, in the multilayer substrate 12, antenna wiring layers 71 to 74 are formed with predetermined patterned internal wiring layers formed on the dielectric layers 13. The antenna wiring layer 71 is connected sequentially by a penetration electrode 22 which penetrates dielectric layers 13 to form an antenna coil. Hereinafter, a configuration of the power-feeding antenna 70 is described with reference to FIGS. 8A and 8B.

FIG. 8A is an exploded perspective view of the power-feeding antenna 70, and FIG. 8B is a plan view thereof. Note that in FIG. 8A, thicknesses of the dielectric layers 13-1 to 13-4, the antenna wiring layers 71 to 74, and the penetration electrodes for connecting the antenna wiring layers 71 to 74 are omitted. FIGS. 8A and 8B exemplify the power-feeding antenna 70 formed from four internal wiring layers 21. The antenna wiring layers 71 to 74 are formed in the dielectric layers 13-1 to 13-4 respectively.

One terminal portion 71a of the antenna wiring layer 71 is connected to the side electrode 14-1 at the side of the multilayer substrate 12. The other terminal portion 71b is connected to one terminal portion 72b of the antenna wiring layer 72 by a penetration electrode which penetrates the dielectric layer 13-1. The other terminal portion 72c of the antenna wiring layer 72 is connected to one terminal portion 73c of the antenna wiring layer 73 by a penetration electrode which penetrates the dielectric layer 13-2. The other terminal portion 73d of the antenna wiring layer 73 is connected to one terminal portion 74d of the antenna wiring layer 74 by a penetration electrode which penetrates the dielectric layer 13-3. The other terminal portion 74e of the antenna wiring layer 74 is connected to the side electrode 14-2 at the side of the multilayer substrate 12. In this manner, the antenna wiring layers 71 to 74 are connected to each other by the penetration electrodes to form a coil-like power-feeding antenna 70. Note that the power-feeding antenna 70 is coil-shaped, but not limited to this shape. For example, a monopole antenna, a patch antenna or the like can be used.

The terminal portion 71a of the antenna wiring layer 71 and the terminal portion 74e of the antenna wiring layer 74 constitute antenna terminals of the power-feeding antenna 70. The one terminal portion 71a of the power-feeding antenna 70 is connected to the semiconductor chip 5 by the side electrode 14-1 and the connection electrode layer 23. The other terminal portion 74e is connected to the semiconductor chip 5 by the side electrode 14-2 and the connection electrode layer 23.

The power-feeding antenna 70 (second antenna) is provided in addition to the antenna 3 (first antenna), thereby appropriately charging electric power irrespective of the existence of a communication signal. Thus, electric power sufficient for operation of the integrated circuit can be stored. Along with the power-feeding antenna 70, the detecting capacitor 44a for a power source circuit can be provided in the body structure 6. As described in Embodiment Mode 2, a plurality of capacitor electrode layers formed from internal wiring layers are stacked and the capacitor electrode layers are connected by the side electrode (or penetration electrode) to form the detecting capacitor 44a.

Embodiment Mode 4

Embodiment Modes 1 to 3 have described the inlet as an example of a semiconductor device of the present invention. The semiconductor device of the present invention is not limited to the inlet. For example, various types of transponders incorporating an inlet are included as the semiconductor device of the present invention. Transponders have various modes, such as a seal label, a barrel, a coin type, a disk type, a card type, a box type, a stick type, and a glass enclosure type. Materials of such transponders can be plastic, glass or ceramic. Typical examples of transponders include a noncontact IC card, an RF tag (an ID tag), and a seal label with a RF tag (an ID tag) function.

Moreover, various types of articles (also referred to as merchandises) providing with an integrated circuit part connected to an antenna of the present invention are also features of the present invention. For example, electronic devices such as mobile phones or portable music player, precision equipment such as watches, clothing items such as buttons, clothes, hats can be provided with an integrated circuit part connected to an antenna of the present invention. The present invention is applied to portable articles or wearable articles, so that such articles can have superior convenience. In addition, a semiconductor device of the present invention is attached to an article as an ID tag, and thus, the historical management of the article's raw material, area of production, manufacturing and processing, distribution, sales, and the like, as well as tracking inquiry becomes possible. That is, the article becomes traceable.

The semiconductor device in the present invention has a semiconductor chip protected by a body structure formed of ceramic or the like. Accordingly, when the semiconductor device is embedded in a paper medium, the semiconductor device can be used without being broken. As examples of a paper medium, the following can be given: paper money, family registers, birth certificates, resident cards, passports, driver's licenses, ID cards, member's cards, letters of authentication, hospital cards, commuter passes, bills, checks, carriage notes, bills of lading, warehouse receipts, stock certificates, bonds, merchandise coupons, tickets, or mortgage securities. In addition, paper (white paper), inkjet printing paper, and the like can serve as forgery preventive paper. For example, a semiconductor device of the present invention can be embedded in documents of various kinds of confidential information, such as contract documents or specification documents.

When a semiconductor device of the present invention is used, a lot of information, that is, more information than the information which is visually shown on a paper medium, can be held in the paper medium. For example, when such a paper medium is applied as a merchandise label or the like, the paper medium can be used for electronic systemization of merchandise management or prevention of merchandise theft. In this embodiment mode, examples of articles using paper incorporating the inlet of the present invention are described with reference to FIGS. 9A to 9E. Note that, as the paper described below, nonwoven fabric, a plastic film, and the like, which are similar to paper, can be used as well as paper produced from pulp.

Figure 9A:
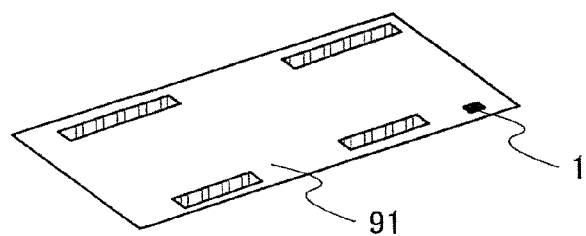
FIGS. 9A to 9E illustrate objects having a piece of paper incorporating an inlet (Embodiment Mode 4).

FIG. 9A is an example of a bearer bond 91 using paper including the inlet 1. The bearer bond 91 includes a stamp, a ticket, an admission ticket, a merchandise coupon, a book coupon, a stationery coupon, a variety of gift coupons, a variety of service coupons, and the like. When the inlet 1 stores identification information of the bearer bond 91, authentication thereof becomes easier. Since the inlet 1 can tolerate a certain level of bending stress, it is not broken even when a pressing pressure is applied thereto by a pointed object such as a pen tip. Therefore, interference of transaction of the merchandise does not occur.

Figure 9B:
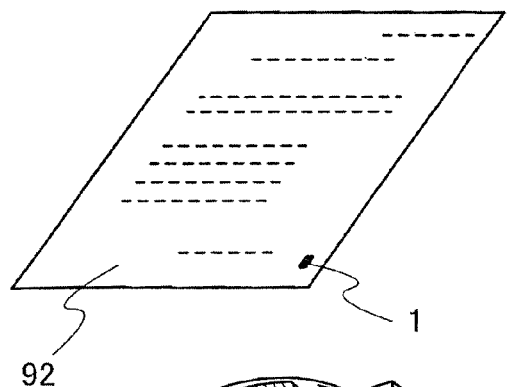

FIG. 9B is an example of a certificate 92 using paper embedded with the inlet 1 of the present invention (for example, a residence certificate, a birth certificate or a family register). When the inlet 1 stores identification information of the certificate 92, authentication thereof becomes easier. Since the inlet 1 has tolerance for a certain level of bending stress, it is not broken even when pressing pressure is applied thereto by a pointed object such as a pen tip. Therefore, even after the certificate 92 is issued, the inlet 1 can be used for certification. Therefore, falsification of the authentication information can be prevented.

Figure 9C:
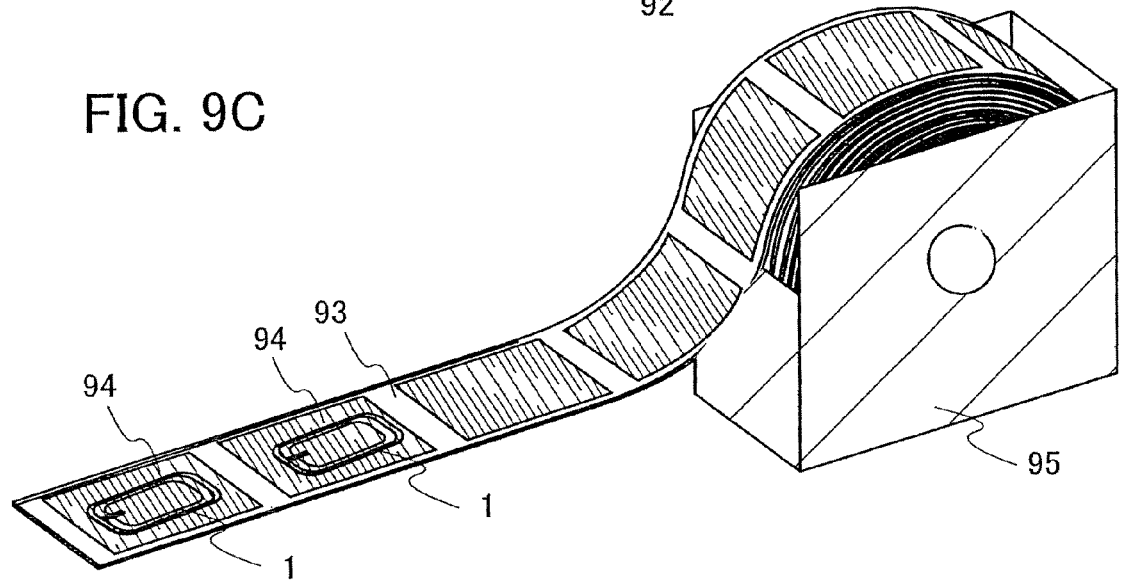

FIG. 9C is an example of a label including the inlet 1 of the present invention. A label (IC label) 94 is formed of the paper embedded with the inlet 1 attached over a label base (separate paper) 93. The labels 94 can be stored in a box 95 and provided there from. The label 94 is provided with a printed surface thereon which shows information on merchandise or service (a name of the merchandise, a brand, a trademark, a trademark owner, a seller, a manufacturer, and the like). Since an individual information that is unique to the merchandise (or the kind of merchandise) can be stored in the inlet 1, it is possible to easily figure out forgery, infringement of intellectual property rights such as a patent right and a trademark right, and illegal activity such as unfair competition. A large amount of information that cannot all be written on a container or a label of the merchandise can be inputted to the inlet 1, for example, the area of production of the merchandise, area of sales, quality, raw material, effect, usage, quantity, shape, price, production method, usage method, time of production, time of use, expiration date, instruction manual, and intellectual property information relating to the merchandise. Accordingly, a transactor or a consumer can access such information with a simple reader. Further, when the inlet 1 includes a write-once memory region in its memory circuit, falsification of the data can be prevented.

Figure 9D:
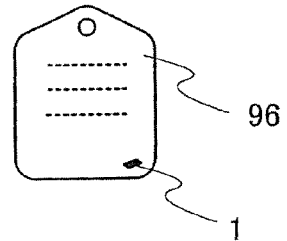
Figure 9E:
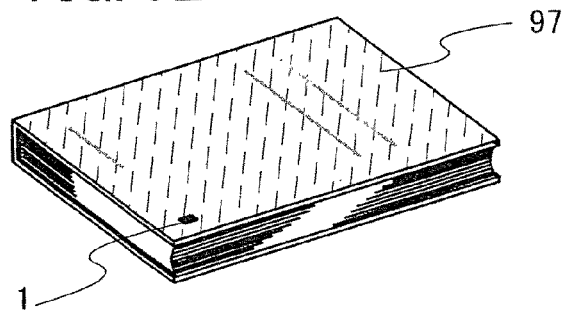

FIG. 9D shows an IC tag 96 including the inlet 1. When the inlet 1 is embedded in paper, the IC tag can be manufactured at a lower cost than a conventional IC tag using a plastic chassis. In a case in which merchandise uses paper, the merchandise and the inlet 1 can be integrated. An example of such a case is shown in FIG. 9E. FIG. 9E shows a book 97 incorporating the inlet 1, and the cover of the book is made of paper embedded with the inlet 1.

This application is based on Japanese Patent Application serial no. 2006-206798 filed in Japan Patent Office on Jul. 28, 2006, the entire contents of which are hereby incorporated by reference.

What is claimed is:
1. A semiconductor device comprising:
a first layer;
a second layer over the first layer, the second layer having a hole;
a connection electrode over the first layer;
a semiconductor chip fixed to a surface of the first layer and electrically connected to the connection electrode;
a penetration electrode which penetrates the second layer and is electrically connected to the connection electrode;
a base material over the second layer; and
an antenna over the base material, the antenna electrically connected to the penetration electrode,
wherein the semiconductor chip is provided between the first layer and the base material,
wherein a first gap between a first inner side surface of the second layer and a first side surface of the semiconductor chip is smaller than a width of the semiconductor chip,
wherein a second gap between a second inner side surface of the second layer and a second side surface of the semiconductor chip is smaller than a width of the semiconductor chip, and
wherein the first inner side surface faces to the second inner side surface.

2. A semiconductor device according to claim 1, wherein each of the first layer and the second layer comprises dielectric material.

3. A semiconductor device according to claim 1, wherein each of the first layer and the second layer comprises ceramic material.

4. A semiconductor device according to claim 1, wherein each of the first layer and the second layer comprises one of rigid plastic and glass.

5. A semiconductor device according to claim 1, wherein each of the first layer and the second layer comprises nanoparticles.

6. A semiconductor device according to claim 1, wherein each of the first layer and the second layer comprises SiC.

7. A semiconductor device according to claim 1,
wherein the first layer has a thickness of 0.1 to 2 μm, and
wherein the second layer has a thickness of 0.1 to 2 m.

8. A semiconductor device according to claim 1, wherein the base material is attached to the second layer through a resin.

9. A semiconductor device comprising:
a body structure having a concave portion;
a connection electrode within the concave portion;
a semiconductor chip fixed to the concave portion and electrically connected to the connection electrode;
a penetration electrode which partly penetrates the body structure and is electrically connected to the connection electrode;
a base material over the body structure; and
an antenna over the base material, the antenna electrically connected to the penetration electrode,
wherein the semiconductor chip is spaced from the base material, wherein a first qap between a first inner side surface of the body structure and a first side surface of the semiconductor chip is smaller than a width of the semiconductor chip, wherein a second qap between a second inner side surface of the body structure and a second side surface of the semiconductor chip is smaller than a width of the semiconductor chip, and wherein the first inner side surface faces to the second inner side surface.

10. A semiconductor device according to claim 9, wherein the body structure comprises dielectric material.

11. A semiconductor device according to claim 9, wherein the body structure comprises ceramic material.

12. A semiconductor device according to claim 9, wherein the body structure comprises one of rigid plastic and glass.

13. A semiconductor device according to claim 9, wherein the body structure comprises nanoparticles.

14. A semiconductor device according to claim 9, wherein the body structure comprises SiC.

15. A semiconductor device according to claim 9, wherein the body structure has a thickness of 10 μm or less.

16. A semiconductor device according to claim 9, wherein the base material is attached to the body structure through a resin.

* * * * *

UNITED STATES PATENT AND TRADEMARK OFFICE
CERTIFICATE OF CORRECTION

PATENT NO. : 8,378,473 B2
APPLICATION NO. : 12/952925
DATED : February 19, 2013
INVENTOR(S) : Shunpei Yamazaki et al.

It is certified that error appears in the above-identified patent and that said Letters Patent is hereby corrected as shown below:

In the Claims

At column 12, line 51, "2 m" should be --2 μm--;

At column 13, line 1, "qap" should be --gap--.

Signed and Sealed this
Thirtieth Day of July, 2013

Teresa Stanek Rea
*Acting Director of the United States Patent and Trademark Office*